United States Patent
Lee et al.

(10) Patent No.: US 11,640,111 B2
(45) Date of Patent: May 2, 2023

(54) PHOTOSENSITIVE RESIN COMPOSITION AND CURED FILM COMPRISING THE SAME

(71) Applicant: LG CHEM, LTD., Seoul (KR)

(72) Inventors: Min Hyung Lee, Daejeon (KR); Dai Seung Choi, Daejeon (KR)

(73) Assignee: LG CHEM, LTD., Seoul (KR)

(*) Notice: Subject to any disclaimer, the term of this patent is extended or adjusted under 35 U.S.C. 154(b) by 999 days.

(21) Appl. No.: 16/467,702

(22) PCT Filed: Jul. 24, 2018

(86) PCT No.: PCT/KR2018/008367
§ 371 (c)(1),
(2) Date: Jun. 7, 2019

(87) PCT Pub. No.: WO2019/054625
PCT Pub. Date: Mar. 21, 2019

(65) Prior Publication Data
US 2020/0004149 A1  Jan. 2, 2020

(30) Foreign Application Priority Data

Sep. 15, 2017  (KR) .................. 10-2017-0118859
Jul. 23, 2018  (KR) .................. 10-2018-0085443

(51) Int. Cl.
*G03F 7/037* (2006.01)
*C08G 73/10* (2006.01)
(Continued)

(52) U.S. Cl.
CPC ......... *G03F 7/037* (2013.01); *C08G 73/1085* (2013.01); *C08G 73/22* (2013.01); *C08L 79/08* (2013.01); *C09D 179/08* (2013.01)

(58) Field of Classification Search
CPC ... G03F 7/037; G03F 7/0387; C08G 73/1085; C08G 73/1067; C08G 73/22; C08G 73/0233
See application file for complete search history.

(56) References Cited

U.S. PATENT DOCUMENTS

2006/0159839 A1  7/2006 Suwa
2008/0108723 A1  5/2008 Taniguchi et al.
(Continued)

FOREIGN PATENT DOCUMENTS

CN  101935453 A  1/2011
CN  106280442 A  1/2017
(Continued)

OTHER PUBLICATIONS

Zhang et al., "High performance crosslinked polyimide based on main-chain type benzoxazine", 2014, RSC Advances, Royal Society of Chemistry, vol. 4, 62550-62556. (Year: 2014).*
(Continued)

*Primary Examiner* — Chanceity N Robinson
*Assistant Examiner* — Anna Malloy
(74) *Attorney, Agent, or Firm* — Rothwell, Figg, Ernst & Manback, P.C.

(57) ABSTRACT

A photosensitive resin composition including a poly(imide-benzoxazine) block copolymer, and a cured film. The poly(imide-benzoxazine) block copolymer included in the photosensitive resin composition enables the formation of a cured film having excellent mechanical and insulation even at a low temperature of less than 200° C.

12 Claims, 1 Drawing Sheet

(51) Int. Cl.
    *C08L 79/08*     (2006.01)
    *C08G 73/22*     (2006.01)
    *C09D 179/08*     (2006.01)

(56) References Cited

U.S. PATENT DOCUMENTS

| | | |
|---|---|---|
| 2010/0285243 A1 | 11/2010 | Kim et al. |
| 2015/0212412 A1 | 7/2015 | Onishi et al. |
| 2016/0297779 A1 | 10/2016 | Hsieh et al. |
| 2018/0079864 A1 | 3/2018 | Kawabata et al. |
| 2021/0284839 A1* | 9/2021 | Komori ............... C08G 73/1042 |

FOREIGN PATENT DOCUMENTS

| | | |
|---|---|---|
| CN | 106633055 A | 5/2017 |
| CN | 106800654 A | 6/2017 |
| JP | 11-282155 A | 10/1999 |
| JP | 2001-296658 A | 10/2001 |
| JP | 2003-012924 A | 1/2003 |
| JP | 2008-239649 A | 10/2008 |
| JP | 2011-227133 A | 11/2011 |
| JP | 2014-050558 A | 3/2014 |
| KR | 10-2010-0121341 A | 11/2010 |
| KR | 10-2013-0087589 A | 8/2013 |
| KR | 10-2016-0020229 A | 2/2016 |
| TW | 200502320 A | 1/2005 |
| TW | 201418889 A | 5/2014 |
| TW | 201641601 A | 12/2016 |
| WO | 2006-098291 A1 | 9/2006 |
| WO | 2018-084149 A1 | 5/2018 |
| WO | WO-2018084149 A1 * | 5/2018 ............... C08F 8/48 |

OTHER PUBLICATIONS

International Search Report and Written Opinion issued for International Application No. PCT/KR2018/008367 dated Nov. 5, 2018, 9 pages.

Yan, Chun, et al., "Synthesis and Characterization of Bisphenol A Diphthalimide Bisbenzoxazine Monomers and the Properties of Their Polybenzoxazines," Journal of Applied Polymer Science, 2011, vol. 121, No. 5, pp. 2778-2787.

Gao, Yu, et al., "Synthesis of novel imide-functionalized fluorinated benzoxazines and properties of their thermosets," High Performance Polymers, 2013, vol. 25, No. 6, pp. 677-684.

Zhang, Kan, et al., "High performance crosslinked polyimide based on main-chain type polybenzoxazine," RSC Advances, Royal Society of Chemistry, 2014, vol. 4, pp. 62550-62556.

* cited by examiner

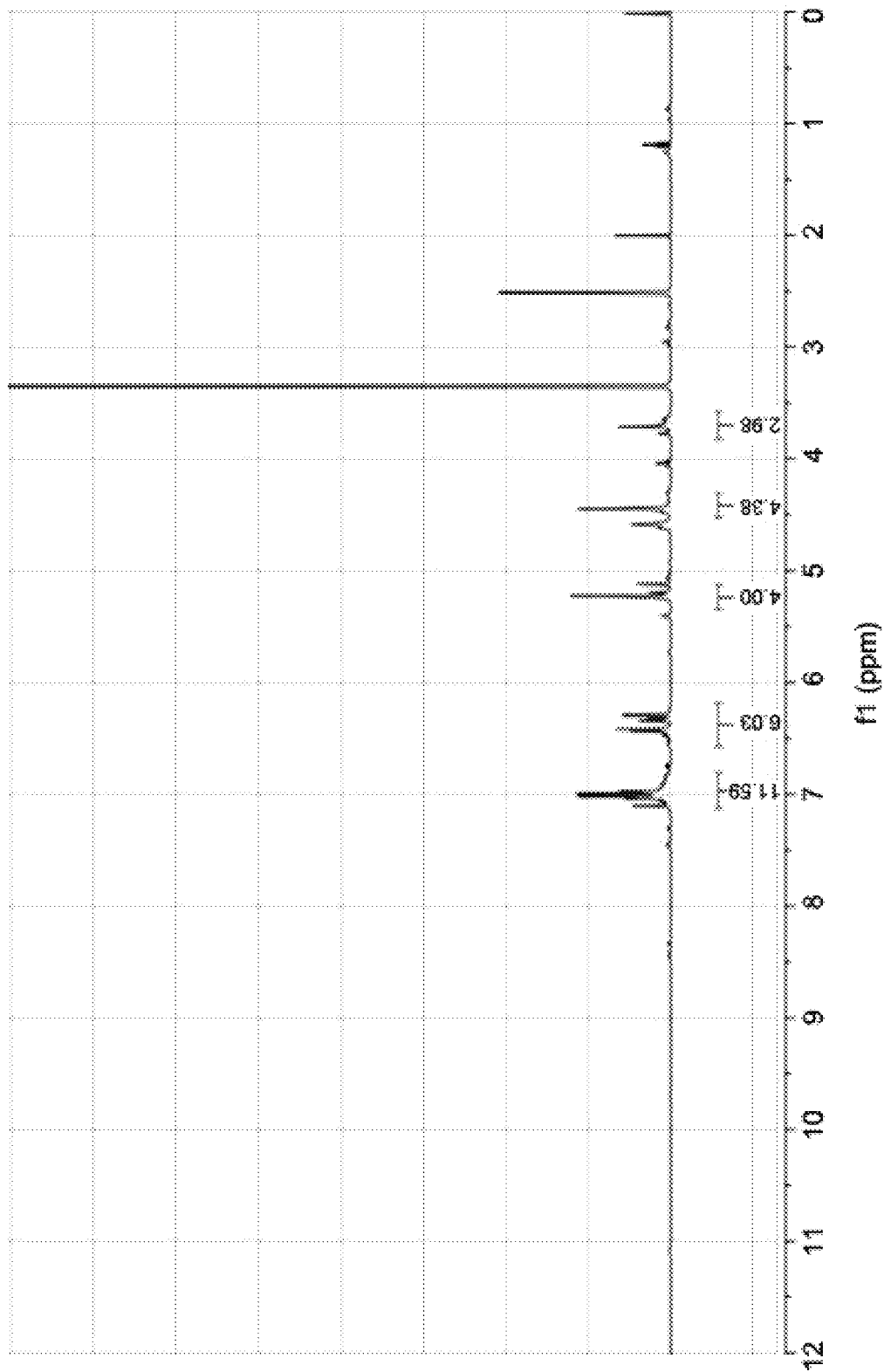

PHOTOSENSITIVE RESIN COMPOSITION AND CURED FILM COMPRISING THE SAME

CROSS-REFERENCE TO RELATED APPLICATION

This application is a 35 U.S.C. § 371 National Phase Entry Application from PCT/KR2018/008367, filed on Jul. 24, 2018, and designating the United States, which claims the benefit of Korean Patent Application No. 10-2017-0118859 filed on Sep. 15, 2017 and Korean Patent Application No. 10-2018-0085443 filed on Jul. 23, 2018 with the Korean Intellectual Property Office, the disclosures of which are herein incorporated by reference in their entirety.

TECHNICAL FIELD

The present invention relates to a photosensitive resin composition and a cured film including the same.

BACKGROUND OF ART

A photosensitive resin is a representative functional polymer material commercialized for the production of various precision electronic and information industrial products, and is currently being importantly used in high technology industries, particularly for the production of semiconductors and displays.

In general, a photosensitive resin is a polymer compound in which a chemical change in the molecular structure occurs within a short time by light irradiation, and thus properties such as solubility to a specific solvent, discoloration, curing, etc. are changed. Using the photosensitive resin, precision micromachining is enabled, energy and raw material use are significantly reduced compared to a thermal reaction process, and the operation can be rapidly and precisely conducted in a small installation space, and thus it is being used in various fields of precision electronics and information industries such as advanced printing, semiconductor production, display production, photocurable surface coating materials, etc.

Such photosensitive resin is largely classified into negative type and positive type. A negative type of photosensitive resin is a type in which the light-irradiated part is insolubilized in a developing solution, and a positive type of photosensitive resin is a type in which the light-irradiated part is solubilized in a developing solution.

Meanwhile, with the recent high integration and micropatterning of electronic devices, a photosensitive resin capable of minimizing a defective fraction and increasing throughput efficiency and resolution is required. Thus, a method using a polyamide acid, a polyamic acid, etc. as a photosensitive resin has been suggested.

However, the polyamide acid is easily hydrolyzed by water in the air, etc., and thus the conservation and stability are not sufficient, polyamic acid has low adhesion to an applied substrate, etc., and the properties of electric wiring or a substrate to which it is applied are deteriorated due to high temperature application. Further, other types of photosensitive resins do not have sufficient chemical resistance, heat resistance, or electrical properties in the finally cured state, or do not have sufficient adhesion to a metal substrate, and thus may be peeled off from the substrate during a developing or curing process.

Particularly, there is a demand for the development of a photosensitive resin material that can form an ultrafine pattern, and can simultaneously prevent thermal damage of a semiconductor device during the heat treatment process for curing of the photosensitive resin composition.

DETAILED DESCRIPTION OF THE INVENTION

Technical Problem

It is an object of the present invention to provide a photosensitive resin composition that enables the formation of a cured film having excellent mechanical and insulation properties even at a low temperature of less than 200° C.

It is another object of the present invention to provide a cured film formed by curing the photosensitive resin composition.

Technical Solution

According to the present invention, a photosensitive resin composition is provided, including:

a poly(imide-benzoxazine) block copolymer including one or more repeat units selected from the group consisting of a repeat unit represented by the following Chemical Formula 1 and a repeat unit represented by the following Chemical Formula 2; and a photo-curable multifunctional acrylic compound.

[Chemical Formula 1]

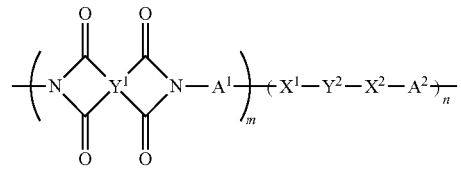

[Chemical Formula 2]

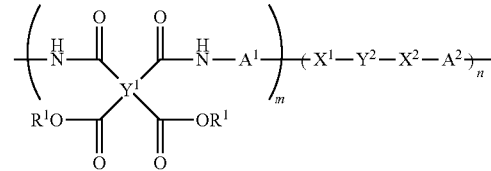

In Chemical Formulas 1 and 2, each of $Y^1$, $Y^2$, $R^1$, $A^1$, $A^2$, $X^1$, $X^2$, m, and n is as defined in the specification.

And, according to the present invention, a cured film formed by curing the photosensitive resin composition is provided.

Hereinafter, a photosensitive resin composition including a poly(imide-benzoxazine) block copolymer and a cured film according to the embodiments of the present invention will be explained in detail.

Technical terms in the present specification are only for mentioning specific embodiments, and they are not intended to restrict the present invention unless there is a particular mention about them.

Singular expressions used herein may include plural expressions unless they are differently expressed contextually.

The meaning of the term "include" used in the specification embodies specific characteristics, areas, essences, steps, actions, elements, and/or components, and does not exclude existence or addition of other specific characteristics, areas, essences, steps, actions, elements, components, and/or groups.

In the chemical formulas of the present invention, the mark

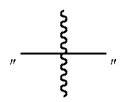

indicates a part where a corresponding group is connected to an adjacent atom.

As the result of continuous studies of the present inventors, it was confirmed that a poly(imide-benzoxazine) block copolymer including one or more repeat units selected from the group consisting of a repeat unit represented by the following Chemical Formula 1 and a repeat unit represented by the following Chemical Formula 2 enables providing of a cured film having excellent mechanical and insulation properties even at a low temperature of less than 200° C.

Particularly, the poly(imide-benzoxazine) block copolymer enables the formation of a cured film having excellent mechanical and insulation properties even at a low temperature of less than 200° C., because intermolecular crosslinking occurs by the repeat unit containing a benzoxazine residue when a photosensitive resin composition including the same is cured.

I. Photosensitive Resin Composition

According to one embodiment of the present invention, a photosensitive resin composition is provided, including:

a poly(imide-benzoxazine) block copolymer including one or more repeat units selected from the group consisting of a repeat unit represented by the following Chemical Formula 1 and a repeat unit represented by the following Chemical Formula 2; and a photo-curable multifunctional acrylic compound.

[Chemical Formula 1]

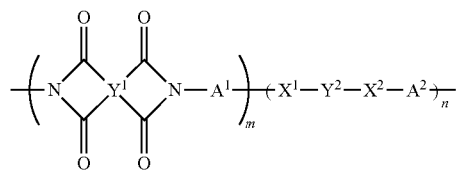

[Chemical Formula 2]

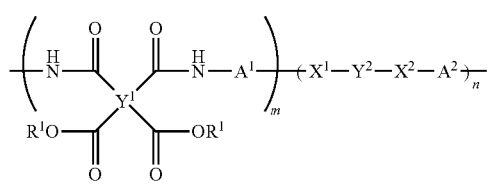

In Chemical Formulas 1 and 2, $Y^1$ is a C6-20 tetravalent aliphatic cyclic group; a C6-20 tetravalent aromatic cyclic group; or a C4-20 tetravalent heteroaromatic cyclic group including one or more heteroatoms selected from the group consisting of N, O, and S; the aliphatic cyclic group, aromatic cyclic group, or heteroaromatic cyclic group may be unsubstituted or substituted with at least one of —OH, —F, —Cl, —Br, —I, —CF$_3$, —CCl$_3$, —CBr$_3$, —Cl$_3$, —NO$_2$, —CN, —COCH$_3$, CH$_3$COO—, and —CO$_2$C$_2$H$_5$; the aliphatic cyclic group, aromatic cyclic group, or heteroaromatic cyclic group may exist alone, two or more rings may be conjugated to form a condensed ring, or two or more rings may be linked by a chemical bond through —O—, —S—, —C(=O)—, —CH(OH)—, —S(=O)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—, $Y^2$ includes a C6-20 divalent aliphatic cyclic group or a C6-20 divalent aromatic cyclic group; the divalent aliphatic or aromatic cyclic group may be unsubstituted or substituted with at least one of —OH, —F, —Cl, —Br, —I, —CF$_3$, —CCl$_3$, —CBr$_3$, —Cl$_3$, —NO$_2$, —CN, —COCH$_3$, CH$_3$COO—, and —CO$_2$C$_2$H$_5$; the divalent aliphatic or aromatic cyclic group may exist alone, two or more rings may be conjugated to form a condensed ring, or two or more rings may be linked by a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—, each $R^1$ is independently a hydrogen atom, 2-hydroxybenzyl, 3-hydroxybenzyl, or 4-hydroxybenzyl, $A^1$ and $A^2$ are each independently a chemical bond; a C6-20 divalent aliphatic cyclic group; a C6-20 divalent aromatic cyclic group; or a C4-20 tetravalent heteroaromatic cyclic group including one or more heteroatoms selected from the group consisting of N, O, and S, $X^1$ and $X^2$ are each independently a group represented by the following Chemical Formula 3a or 3b,

[Chemical Formula 3a]

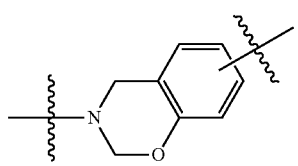

[Chemical Formula 3b]

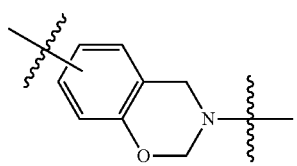

wherein the mark

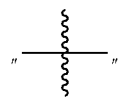

indicates a part where the group represented by Chemical Formula 3a or 3b is linked to an adjacent atom in Chemical Formula 1, and m and n are each independently a number of 5 to 10,000.

The poly(imide-benzoxazine) block copolymer of Chemical Formula 1 is a block-copolymerized polymer of a first repeat unit including an imide bond and having a polymerization degree of m, and a second repeat unit including a benzoxazine residue and having a polymerization degree of n.

The poly(imide-benzoxazine) block copolymer of Chemical Formula 2 is a block-copolymerized polymer of a first repeat unit including the precursor of an imide bond and having a polymerization degree of m, and a second repeat unit including a benzoxazine residue and having a polymerization degree of n.

In Chemical Formulas 1 and 2, $Y^1$ is a C6-20 tetravalent aliphatic cyclic group; a C6-20 tetravalent aromatic cyclic group; or a C4-20 tetravalent heteroaromatic cyclic group including one or more heteroatoms selected from the group consisting of N, O, and S.

Here, the aliphatic cyclic group, aromatic cyclic group or heteroaromatic cyclic group constituting $Y^1$ may be unsubstituted or substituted with at least one of —OH, —F, —Cl, —Br, —I, —CF$_3$, —CBr$_3$, —NO$_2$, —CN, —COCH$_3$, CH$_3$COO—, and —CO$_2$C$_2$H$_5$.

Further, the aliphatic cyclic group, aromatic cyclic group, or heteroaromatic cyclic group constituting $Y^1$ may exist alone, two or more rings may be conjugated to form a condensed ring, or two or more rings may be linked by a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—.

Specifically, $Y^1$ may be a tetravalent group selected from the group consisting of the following structural formulas.

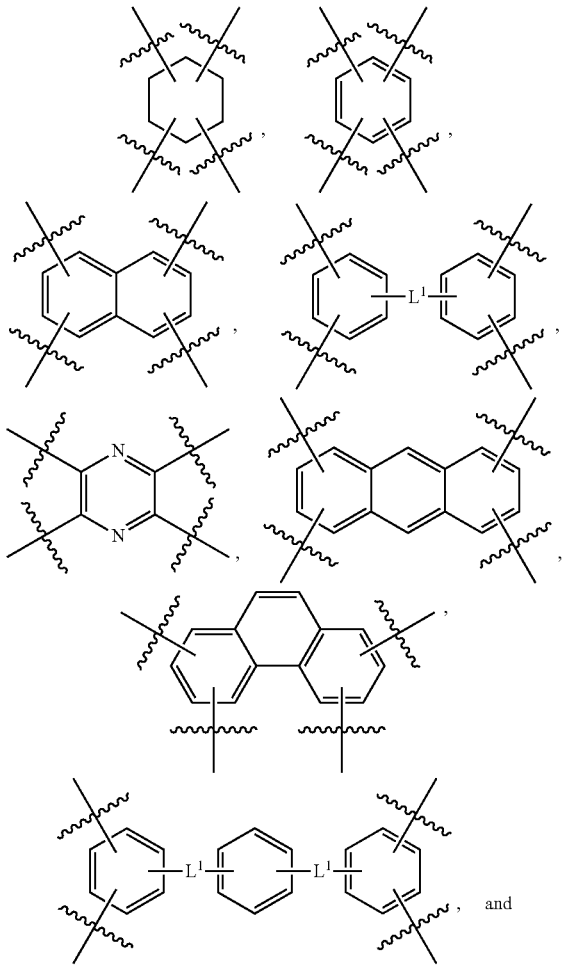

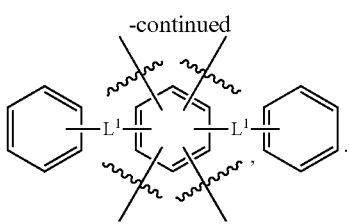

In the structural formulas,
each cyclic group may be unsubstituted or substituted with —OH, —F, —Cl, —Br, —I, —CF$_3$, —CCl$_3$, —CBr$_3$, —Cl$_3$, —NO$_2$, —CN, —COCH$_3$, CH$_3$COO—, or —CO$_2$O$_2$H$_5$, each $L^1$ is independently a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—, and

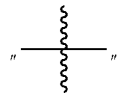

is a part where the tetravalent group is linked to an adjacent atom in Chemical Formula 1.

In Chemical Formula 1, $Y^2$ includes a C6-20 divalent aliphatic cyclic group or a C6-20 divalent aromatic cyclic group; and the divalent aliphatic or aromatic cyclic group may be unsubstituted or substituted with at least one of —OH, —F, —Cl, —Br, —I, —CF$_3$, —CBr$_3$, —Cl$_3$, —NO$_2$, —CN, —COCH$_3$, CH$_3$COO—, and —CO$_2$O$_2$H$_5$.

The divalent aliphatic or aromatic cyclic group constituting $Y^2$ may exist alone, two or more rings may be conjugated to form a condensed ring, or two or more rings may be linked by a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤p≤10), —C(CH$_3$)$_2$—, —C(CF$_3$)$_2$—, or —C(=O)NH—.

Specifically, $Y^2$ may be a divalent group selected from the group consisting of the following structural formulas.

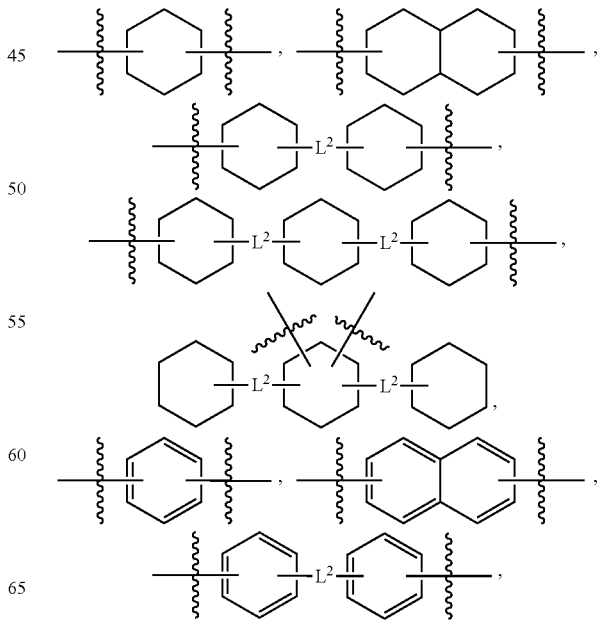

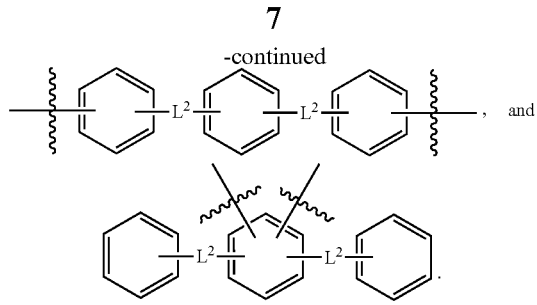

In the structural formulas, each cyclic group may be unsubstituted or substituted with —OH, —F, —Cl, —Br, —I, —CF$_3$, —CCl$_3$, —CBr$_3$, —Cl$_3$, —NO$_2$, —CN, —COCH$_3$, CH$_3$COO—, or —CO$_2$O$_2$H$_5$, each L$^2$ is independently a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—, and

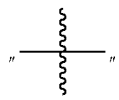

is a part where the divalent group is linked to an adjacent atom in Chemical Formula 1.

In Chemical Formula 2, each R$^1$'s may independently be a hydrogen atom, 2-hydroxybenzyl, 3-hydroxybenzyl, or 4-hydroxybenzyl, and preferably, hydrogen.

In Chemical Formulas 1 and 2, A$^1$ and A$^2$ are each independently a chemical bond; a C6-20 divalent aliphatic cyclic group; a C6-20 divalent aromatic cyclic group; or a C4-20 tetravalent heteroaromatic cyclic group including one or more heteroatoms selected from the group consisting of N, O, and S, In case A$^1$ and/or A$^2$ is a "chemical bond", it means that A$^1$ and/or A$^2$ is a chemical bond simply connecting both side groups.

Specifically, A$^1$ and A$^2$ may each independently be a chemical bond or a divalent group selected from the group consisting of the following structural formulas.

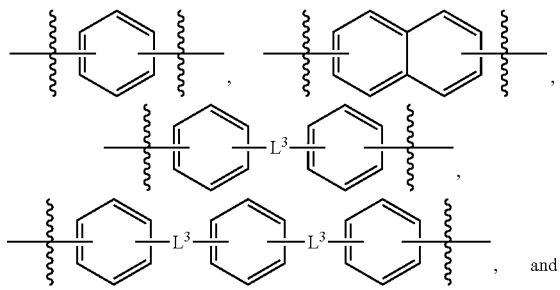

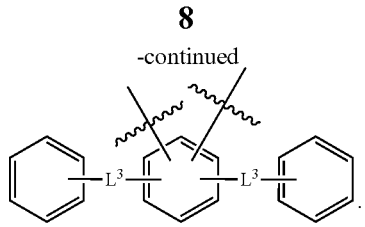

In the structural formulas, each L$^3$ is independently a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—, and

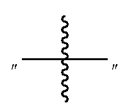

is a part where the divalent group is linked to an adjacent atom in Chemical Formula 1.

In Chemical Formulas 1 and 2, X$^1$ and X$^2$ are residues derived from benzoxazine, and each is independently a group represented by the following Chemical Formula 3a or 3b.

[Chemical Formula 3a]

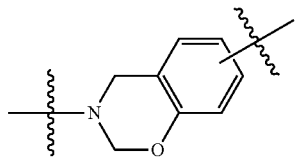

[Chemical Formula 3b]

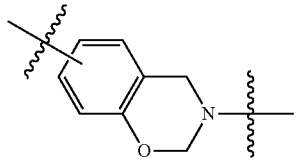

Herein, the mark

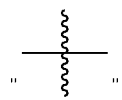

indicates a part where the group represented by Chemical Formula 3a or 3b is linked to an adjacent atom in Chemical Formula 1.

In Chemical Formulas 1 and 2, m is the polymerization degree of the first repeat unit including an imide bond, and n is the polymerization degree of the second repeat unit including a benzoxazine residue, and each is independently a number of 5 to 10,000.

As non-limiting examples, the poly(imide-benzoxazine) block copolymer may include a repeat unit represented by the following Chemical Formula 4.

[Chemical Formula 4]

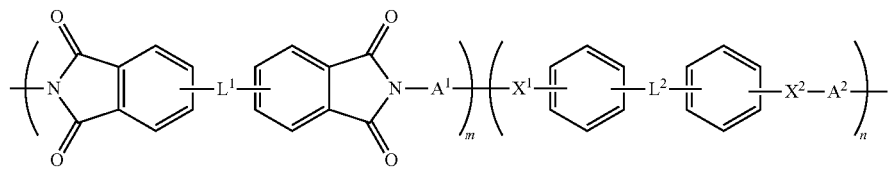

In Chemical Formula 4, $A^1$, $A^2$, $X^1$, $X^2$, m, and n are each independently as defined in Chemical Formula 1, and $L^1$ and $L^2$ are each independently a chemical bond through —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —C(CH$_3$)$_2$—, —C(CF$_3$)$_2$—, or —C(=O)NH—.

However, Chemical Formula 4 is no more than one example of the repeat unit represented by Chemical Formula 1, the poly(imide-benzoxazine) block copolymer is not limited to the repeat unit of Chemical Formula 4, and it may have the above-explained aliphatic cyclic groups.

It is preferable that in the poly(imide-benzoxazine) block copolymer, a weight ratio of the repeat unit having a polymerization degree m and the repeat unit having a polymerization degree n is 1:0.01 to 1:100.

That is, in order to manifest low the temperature curing property according to the introduction of the second repeat unit while forming a cured film with excellent mechanical properties, it is preferable that the weight ratio of the first repeat unit and the second repeat unit is 1:0.01 to 1:100. More preferably, the weight ratio of the first repeat unit and the second repeat unit may be 1:1 to 1:10.

It is preferable that the poly(imide-benzoxazine) block copolymer has a weight average molecular weight of 5000 to 100,000 g/mol, 7000 to 80,000 g/mol, or 10,000 to 75,000 g/mol, for the formation of a cured film with excellent mechanical properties.

The poly(imide-benzoxazine) block copolymer may be prepared by a method including: the first step of reacting an aminophenol compound with an anhydride compound; the second step of adding a diamine compound and a polyoxymethylene compound to the reaction product of the first step to react them; the third step of adding an aminophenol compound and a carbonyl benzoate compound to the reaction product of the second step to react them; and the fourth step of adding maleic anhydride or acetic anhydride to the reaction product of the third step to react them.

Through the steps 1 to 3, a precursor resin represented by the following Chemical Formula 2 may be obtained, and through chemical imidation of the fourth step, a poly(imide-benzoxazine) block copolymer represented by the above Chemical Formula 1 may be obtained.

The precursor resin represented by Chemical Formula 4 may be applied for a photosensitive resin composition in the state of the poly(imide-benzoxazine) block copolymer, or it may be applied for the photosensitive resin composition in the state of a precursor.

The preparation method of the poly(imide-benzoxazine) block copolymer will be explained in more detail in the examples.

Since the photosensitive resin composition according to the embodiment of the invention includes the above-described poly(imide-benzoxazine) block copolymer, intermolecular crosslinking occurs by the repeat unit including the benzoxazine residue when cured at a low temperature, thus providing a cured film having excellent mechanical properties even at a low temperature less than 200° C.

Meanwhile, the photosensitive resin composition includes a photocurable multifunctional acrylic compound as a crosslinking agent.

The photocurable multifunctional acrylic compound is a compound wherein at least two acrylic structures capable of photocuring exist in the molecule, and specifically, it may include one or more acrylic compounds selected from the group consisting of an acrylate-based compound, a polyester acrylate-based compound, a polyurethane acrylate-based compound, an epoxy acrylate-based compound, and a caprolactone modified acrylate-based compound.

For example, the acrylate-based compound may include a hydroxyl group containing an acrylate-based compound such as pentaerythritol triacrylate, dipentaerythritol pentaacrylate, etc.; a water soluble acrylate-based compound such as polyethylene glycol diacrylate, polypropylene glycol diacrylate, etc.; and the polyester acrylate-based compound may include trimethylol propane triacrylate, pentaerythritol tetraacrylate, dipentaerythritol hexaacrylate, etc.

Further, the polyurethane acrylate-based compound may include an isocyanate modified product of the hydroxyl group containing acrylate-based compound, the epoxy acrylate-based compound may include bisphenol A diglycidyl ether, hydrogenated bisphenol A diglycidyl ether, a (meth)acrylic acid addition product of phenol novolac epoxy resin, etc., and the caprolactone modified acrylate-based compound may include caprolactone modified ditrimethylol propane tetraacrylate, ε-caprolactone modified dipentaerythritol acrylate, caprolactone modified hydroxylpyvalic acid neopentyl glycol ester diacrylate, etc.

The photocurable multifunctional acrylic compound may be included in the contents of 1 to 50 parts by weight, 5 to 40 parts by weight, or 10 to 30 parts by weight, based on 100 parts by weight of the poly(imide-benzoxazine) block copolymer.

That is, in order to manifest a sufficient crosslinking effect, it is preferable that the photocurable multifunctional acrylic compound may be included in the content of 1 part by weight or more, based on 100 parts by weight of the poly(imide-benzoxazine) block copolymer.

However, if an excess amount of the photocurable multifunctional acrylic compound is applied for the photosensitive resin composition, low temperature curability and insulation properties due to the poly(imide-benzoxazine) block copolymer may be deteriorated. Thus, it is preferable that the photocurable multifunctional acrylic compound may be included in the content of 50 parts by weight or less, based on 100 parts by weight of the poly(imide-benzoxazine) block copolymer.

The photosensitive resin composition may include an epoxy resin.

The epoxy resin may have a function for assisting a substrate used in a semiconductor device or a display device to exhibit high cohesion and adhesion.

Such epoxy resin may include, for example, one or more selected from the group consisting of a bisphenol A type of epoxy resin, a hydrogenated bisphenol A type of epoxy resin, a bromated bisphenol A type of epoxy resin, a bisphenol F type of epoxy resin, a bisphenol S type of epoxy resin, a novolac type of epoxy resin, a phenol novolac type of epoxy resin, a cresol novolac type of epoxy resin, an N-glycidyl type of epoxy resin, a bisphenol A novolac type of epoxy resin, a bixylenol type of epoxy resin, a biphenol type of epoxy resin, a chelate type of epoxy resin, a glyoxal type of epoxy resin, an amino group containing epoxy resin, a rubber modified epoxy resin, a dicyclopentadiene phenolic type of epoxy resin, a diglycidyl phthalate resin, a heterocyclic epoxy resin, a tetraglycidyl xylenoyl ethane resin, a silicon modified epoxy resin, and an ε-caprolactone modified epoxy resin, and preferably, it may include a liquid type of N-glycidyl epoxy resin.

The epoxy resin may be included in the content of 5 to 100 parts by weight, 10 to 100 parts by weight, or 10 to 75 parts by weight, based on 100 parts by weight of the poly(imide-benzoxazine) block copolymer.

The photosensitive resin composition may include a photoacid generator.

As the photoacid generator, compounds known to have a photoinitiation effect in the technical field to which the present invention pertains may be applied without specific limitations.

As non-limiting examples, the photoacid generator may be one or more compounds selected from the group consisting of a phenolic compound, an acetophenone-based compound, a biimidazole-based compound, a triazine-based compound, and an oxime-based compound.

The phenolic compound may be resorcinol, phloroglucinal, 2,3,4-trihydroxybenzophenone, 2,3,4,4'-tetrahydroxybenzophenone, 2,3,4,3',4',5'-hexahydroxybenzophenone, 2,4,2',4'-biphenyltetraol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, para[α,α,α',α'-tetrakis(4-hydroxyphenyl)]xylene, etc.

The acetophenone-based compound may be 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexylphenylketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one, 2-methyl-1-[4-(methylthio)phenyl]-2-morpholinopropane-1-one, etc.

The biimidazole-based compound may be 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, 2,2'-bis(o-chlorophenyl)-4,4,5,5'-tetraphenyl-1,2'-biimidazole, etc.

The triazine-based compound may be 3-{4-[2,4-bis(trichloromethyl)-s-triazine-6-yl]phenylthio}propionic acid, 1,1,1,3,3,3-hexafluoroisopropyl-3-{4-[2,4-bis(trichloromethyl)-s-triazine-6-yl]phenylthio}propionate, ethyl-2-{4-[2,4-bis(trichloromethyl)-s-triazine-6-yl]phenylthio}acetate, 2-epoxyethyl-2-{4-[2,4-bis(trichloromethyl)-s-triazine-6-yl]phenylthio}acetate, cyclohexyl-2-{4-[2,4-bis(trichloromethyl)-s-triazine-6-yl]phenylthio}acetate, benzyl-2-{4-[2,4-bis(trichloromethyl)-s-triazine-6-yl]phenylthio}acetate, 3-{chloro-4-[2,4-bis(trichloromethyl)-s-triazine-6-yl]phenylthio}propionic acid, 3-{4-[2,4-bis(trichloromethyl)-s-triazine-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3-butadienyl-s-triazine, 2-trichloromethyl-4-amino-6-p-methoxystyryl-s-triazine, etc.

The oxime-based compound may be 1,2-octadione-1-(4-phenylthio)phenyl-2-(o-benzoyloxime), ethanone-1-(9-ethyl)-6-(2-methylbenzoyl-3-yl)-1-(o-acetyloxime), etc.

The content of the photoacid generator may differ according to the kind of the compound.

However, preferably, the photoacid generator may be included in the content of 0.1 to 50 parts by weight, 1 to 50 parts by weight, 1 to 30 parts by weight, 5 to 30 parts by weight, 5 to 20 parts by weight, or 5 to 15 parts by weight, based on 100 parts by weight of the poly(imide-benzoxazine) block copolymer.

That is, in order to manifest a sufficient photoacid generation effect, it is preferable that the photoacid generator may be included in the content of 0.1 parts by weight or more, based on 100 parts by weight of the poly(imide-benzoxazine) block copolymer. However, if an excess amount of the photoacid generator is applied to the photosensitive resin composition, due to the photoacid generator remaining after the crosslinking reaction, the stability of the cured film may be deteriorated. Thus, it is preferable that the photoacid generator may be included in the content of 50 parts by weight or less, based on 100 parts by weight of the poly(imide-benzoxazine) block copolymer.

The photosensitive resin composition may include a photoinitiator.

As the photoinitiator, any compounds known to have a crosslinking reaction inducing effect in the technical field to which the present invention pertains may be used without specific limitations.

As non-limiting examples, the photoinitiator may include 1,3,5,6-tetrakis(methoxymethyl)tetrahydroimidazo[4,5-d]imidazole-2,5 (1H,3H)-dione(1,3,4,6-tetrakis(methoxymethyl)tetrahydroimidazo[4,5-d]imidazole-2,5(1H,3H)-dione), 1,3,5,6-tetrakis(butoxymethyl)tetrahydroimidazo[4,5-d]imidazole-2,5(1H, 3H)-dione(1,3,4,6-tetrakis(butoxymethyl)tetrahydroimidazo[4,5-d]imidazole-2,5(1H, 3H)-dione), 2,6-bis(hydroxymethyl)benzene-1,4-dio(2,6-bis(hydroxymethyl)benzene-1,4-diol), hexakis(methoxymethyl)-1,3,5-triazine-2,4,6-triamine(hexakis(methoxymethyl)-1,3,5-triazine-2,4,6-triamine), (propane-2,2-diylbis(2-hydroxybenzene-5,3,1-triyl))tetramethanol ((propane-2,2-diylbis(2-hydroxybenzene-5,3,1-triyl))tetramethanol), 4,4'-(propane-2,2-diyl)bis(2,6-bis(methoxymethyl)phenol)(4,4'-(propane-2,2-diyl)bis(2,6-bis(methoxymethyl)phenol)), 3,3',5,5'-tetrakis(hydroxymethyl)-[1,1'-biphenyl]-4,4'-diol(3,3',5,5'-tetrakis(hydroxymethyl)-[1,1'-biphenyl]-4,4'-diol), 3,3',5,5'-tetrakis(methoxymethyl)-[1,1'-biphenyl]-4,4'-diol(3,3',5,5'-tetrakis(methoxymethyl)-[1,1'-biphenyl]-4,4'-diol), etc.

The photoinitiator may be included in the content of 1 to 50 parts by weight, 5 to 40 parts by weight, or 10 to 30 parts by weight, based on 100 parts by weight of the poly(imide-benzoxazine) block copolymer.

That is, in order to manifest a sufficient photoinitiation effect, it is preferable that the photoinitiator is included in the content of 1 part by weight or more, based on 100 parts by weight of the poly(imide-benzoxazine) block copolymer. However, if an excess amount of the photoinitiator is used in the photosensitive resin composition, due to the remaining photoinitiator, the stability of a cured film may be deteriorated. Thus, it is preferable that the photoinitiator is included in the content of 50 parts by weight or less, based on 100 parts by weight of the poly(imide-benzoxazine) block copolymer.

The photosensitive resin composition may further include one or more kinds of curing accelerator selected from the group consisting of an imidazole-based compound, a phosphine-based compound, and a tertiary amine compound.

The imidazole-based compound may be, for example, 2-phenylimidazole, 2-phenyl-4-methylimidazole, or 2-phenyl-4-methyl-5-hydroxymethylimidazole, the phosphine-based compound may be, for example, triphenylphosphine, diphenylphosphine, phenylphosphine, or tetraphenylphosphonium tetraphenyl borate, and the tertiary amine compound may be, for example, dicyandiamide, benzyldimethylamine, 4-(dimethylamino)-N,N-dimethylbenzylamine, 4-methoxy-N,N-dimethylbenzylamine, or 4-methyl-N,N-dimethylbenzylamine.

The curing accelerator may be included in the content of 0.1 to 10 parts by weight, based on 100 parts by weight of the poly(imide-benzoxazine) block copolymer.

The photosensitive resin composition may include a solvent.

As the solvent, any compounds known to enable the formation of a photosensitive resin composition layer in the technical field to which the present invention pertains may be used without specific limitations.

As non-limiting examples, the solvent may be one or more compounds selected from the group consisting of esters, ethers, ketones, aromatic hydrocarbons, and sulfoxides.

The ester solvent may be ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, gamma-butyrolactone, ε-caprolactone, delta-valerolactone, alkyl oxyacetate (for example, methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate, etc.)), 3-oxypropionate alkyl ester (for example, methyl 3-oxypropionate, ethyl 3-oxypropionate (for example, methyl 3-methoxypropionate, ethyl 3-methoxypropionate, methyl 3-ethoxypropionate, ethyl 3-ethoxypropionate, etc.)), 2-oxypropionate alkyl ester (for example: methyl 2-oxypropionate, ethyl 2-oxypropionate, propyl 2-oxypropionate (for example, methyl 2-methoxypropionate, ethyl 2-methoxypropionate, propyl 2-methoxypropionate, methyl 2-ethoxypropionate, ethyl 2-ethoxypropionate, etc.)), methyl 2-oxy-2-methylpropionate, ethyl 2-oxy-2-methylpropionate (for example, methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutanoate, ethyl 2-oxobutanoate, etc.

The ether solvent may be diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, etc.

The ketone solvent may be methylethylketone, cyclohexanone, cyclopentanone, 2-heptanone, 3-heptanone, N-methyl-2-pyrrolidone, etc.

The aromatic hydrocarbon solvent may be toluene, xylene, anisole, limonene, etc.

The sulfoxide solvent may be dimethyl sulfoxide, etc.

The solvent may be included in the content of 50 to 500 parts by weight, 100 to 500 parts by weight, 100 to 300 parts by weight, 100 to 250 parts by weight, or 100 to 150 parts by weight, based on 100 parts by weight of the poly(imide-benzoxazine) block copolymer, in terms of coatability of the photosensitive resin composition.

The photosensitive resin composition may further include additives such as a surfactant, a coupling agent, a filler, an antioxidant, a UV absorber, an anti-aggregation agent, an anti-corrosive agent, an anti-foaming agent, an anti-gelling agent, etc., as necessary.

For example, as an adhesion enhancer, a silane coupling agent having a functional group such as an epoxy, a carboxyl group, or isocyanate, etc. may be used, and specific examples thereof may include trimethoxysilyl benzoic acid, triethoxysilyl benzoic acid, gamma-isocyanatopropyltrimethoxysilane, gamma-isocyanatopropyltriethoxysilane, gamma-glycidoxypropyltrimethoxysilane, gamma-glycidoxypropyltriethoxysilane, or a mixture thereof. Such an adhesion enhancer may be included in the content of 0.1 to 10 parts by weight, based on 100 parts by weight of the poly(imide-benzoxazine) block copolymer.

As the surfactant, those known to be usable in a photosensitive resin composition may be used without specific limitations, but a fluorine-containing surfactant or a silicon-based surfactant is preferable. Such surfactant may be included in the content of 0.1 to 5 parts by weight, based on 100 parts by weight of the poly(imide-benzoxazine) block copolymer.

II. Cured Film

According to another embodiment of the invention, a cured film formed by curing the photosensitive resin composition is provided.

Since the photosensitive resin composition includes the above-explained poly(imide-benzoxazine) block copolymer, it enables the formation of a cured film having excellent mechanical properties even at a low temperature of less than 200° C.

Particularly, the cured film exhibits excellent heat resistance and insulation properties, and thus may be preferably applied to a dielectric film of a semiconductor device, an interlayer dielectric film for rerouting, etc. Further, the cured film may be applied for a photoresist, as etching resist, a solid top resist, etc.

The cured film may be formed by a process of applying the photosensitive resin composition on a substrate, an exposure process of irradiating active rays or radiation to the photosensitive resin composition applied on the substrate, a process of developing the exposed photosensitive resin composition, a process of heating the developed photosensitive resin composition, etc.

The process of applying the photosensitive resin composition on a substrate may be conducted by spinning, soaking, doctor blade coating, suspension casting, coating, spraying, electrostatic spraying, reverse roll coating, etc. Here, the amount of the photosensitive resin composition applied and the kind of the substrate depend on the use and application field of the cured film. It is preferable that the photosensitive resin composition is dried under appropriate conditions after being applied on a substrate.

In the exposure process, active rays or radiation of a predetermined pattern are irradiated to the photosensitive resin composition applied on the substrate. In the exposure process, active rays or radiation of a 200 to 600 nm wavelength may be applied. As an exposure device, various exposure apparatuses such as a mirror projection aligner, a scanner, a stepper, a proximity exposer, a contact exposer, a microlens array, a laser exposer, a lens scanner, etc. may be used.

In the development process, the non-exposed part of the photosensitive resin composition is developed using a developing solution. Here, as the developing solution, an aqueous alkaline developing solution, an organic solvent, etc. may be used.

Advantageous Effects

The poly(imide-benzoxazine) block copolymer included in the photosensitive resin composition of the present invention enables the formation of a cured film having excellent mechanical and insulation properties even at a low temperature of less than 200° C.

BRIEF DESCRIPTION OF THE DRAWING

FIG. 1 shows an NMR spectrum of a material C synthesized in Example 1.

DETAILED DESCRIPTION OF THE EMBODIMENTS

Hereinafter, preferable examples are presented for better understanding of the present invention. However, these examples are presented only as illustrations of the invention, and the present invention is not limited thereby.

Example 1

In a 500 mL round flask equipped with a Dean-Stark apparatus and a condenser, 8 g of 4-aminophenol was dissolved in 100 ml of tetrahydrofuran (THF), and 20 ml of trifluoroacetic anhydride was added dropwise thereto at 0° C. After the mixture was reacted for 2 hours, the solvent was removed, followed by extraction with ethyl acetate and an aqueous solution of $NaHCO_3$. The obtained organic layer was precipitated in hexane to obtain material A.

4 g of the material A, 1.9 g of 4,4'-diaminodiphenylmethane, and 1.4 g of paraformaldehyde were dissolved in 15 ml of a solution of chlorobenzene:xylene (1:1), and the mixture was reacted at 120° C. for 3 hours. After the reaction, the mixture was precipitated in hexane and filtered. The obtained solid was dissolved in ethyl acetate and extracted with the aqueous solution of $Na_2CO_3$. The solvent of the obtained organic layer was removed to obtain material B.

4 g of the material B was dissolved in 50 ml of a solution of ethyl acetate:methanol (100:1), and $NaBH_4$ was added thereto. After the mixture was reacted for 7 hours, brine was added for extraction. The obtained organic layer was put in hexane for precipitation. The obtained solid was dried to obtain material C. The $^1H$ NMR spectrum (DMSO-$d_6$, standard material TMS) of the material C is shown in FIG. 1.

1 g of the material C and 5 g of 5,5'-(perfluoropropane-2,2-diyl)bis(2-aminophenol) were dissolved in N-methyl-2-pyrrolidone(NMP). Thereto, 3.4 g of dibutyl 5,5'-oxybis(2-(chlorocarbonyl)benzoate) was slowly added dropwise at 0° C. After the mixture was reacted for 2 hours, 1.2 g of maleic anhydride was added and the mixture was additionally reacted for 2 hours. After the reaction, excess distilled water was dripped therein to produce a precipitate. The precipitate was filtered and washed with water three times, and then dried under a 100° C. vacuum condition for 24 hours to obtain 5 g of a poly(imide-benzoxazine) block copolymer (PIBZ-1).

The molecular weight of the copolymer (PIBZ-1) was measured by GPC under a THF solvent, and as the result, it was confirmed that the copolymer had a number average molecular weight (Mn) of 7000 g/mol and a weight average molecular weight (Mw) of 12,000 g/mol.

Example 2

5 g of a poly(imide-benzoxazine) block copolymer (PIBZ-2) was obtained by the same method as Example 1, except that the content of the material C was changed to 3 g, and the content of dibutyl 5,5'-oxybis(2-(chlorocarbonyl)benzoate) was changed to 4.6 g.

The molecular weight of the copolymer (PIBZ-2) was measured by GPC under a THF solvent, and as the result, it was confirmed that the copolymer had a number average molecular weight (Mn) of 7500 g/mol and a weight average molecular weight (Mw) of 12,000 g/mol.

Example 3

5 g of a poly(imide-benzoxazine) block copolymer (PIBZ-3) was obtained by the same method as Example 1, except that 4.8 g of 5,5'-(perfluoropropane-2,2-diyl)bis(2-aminobenzene) was used instead of 5 g of 5,5'-(perfluoropropane-2,2-diyl)bis(2-aminophenol).

The molecular weight of the copolymer (PIBZ-3) was measured by GPC under a THF solvent, and as the result, it was confirmed that the copolymer had a number average molecular weight (Mn) of 7000 g/mol and a weight average molecular weight (Mw) of 12,500 g/mol.

Example 4

5 g of a poly(imide-benzoxazine) block copolymer (PIBZ-4) was obtained by the same method as Example 1, except that 4.0 g of bis(2-(acryloyloxy)ethyl) 5,5'-oxybis(2-(chlorocarbonyl)benzoate) was used instead of 3.4 g of dibutyl 5,5'-oxybis(2-(chlorocarbonyl)benzoate).

The molecular weight of the copolymer (PIBZ-4) was measured by GPC under a THF solvent, and as the result, it was confirmed that the copolymer had a number average molecular weight (Mn) of 8000 g/mol and a weight average molecular weight (Mw) of 14,000 g/mol.

Example 5

10.0 g of the block copolymer (PIBZ-1) according to Example 1 was dissolved in 35 g of N-methyl-2-pyrrolidone (NMP), and 2.1 g of 2-isocyanatoethyl methacrylate was added thereto. The mixture was reacted at 60° C. for 8 hours, and then precipitated with 500 ml of methanol. The precipitate was filtered and washed with water three times, and then dried under a 100° C. vacuum condition for 24 hours to obtain 8 g of a poly(imide-benzoxazine) block copolymer (PIBZ-5).

The molecular weight of the copolymer (PIBZ-5) was measured by GPC under a THF solvent, and as the result, it was confirmed that the copolymer had a number average molecular weight (Mn) of 8000 g/mol and a weight average molecular weight (Mw) of 13,000 g/mol.

Example 6

4.8 g of a poly(imide-benzoxazine) block copolymer (PIBZ-6) was obtained by the same method as Example 1, except that 1.9 g of 4,4'-oxydianiline was used instead of 1.9 g of 4,4'-diaminodiphenyl methane.

The molecular weight of the copolymer (PIBZ-6) was measured by GPC under a THF solvent, and as the result, it was confirmed that the copolymer had a number average molecular weight (Mn) of 9000 g/mol and a weight average molecular weight (Mw) of 17,000 g/mol.

Example 7

Material C was obtained by the same method as Example 1.

1 g of the material C and 5 g of 5,5'-(perfluoropropane-2,2-diyl)bis(2-aminophenol) were dissolved in N-methyl-2-pyrrolidone (NMP). After raising the temperature to 80° C., 3.8 g of 4,4'-oxydiphthalic anhydride was added dropwise, and the mixture was reacted for 2 hours. Thereafter, 0.5 g of pyridine and 2.1 g of acetic anhydride were slowly introduced. After the mixture was reacted for 12 hours, it was precipitated with 500 ml of methanol. The precipitate was filtered and washed with water three times, and then dried under a 100° C. vacuum condition for 24 hours to obtain 8 g of poly(imide-benzoxazine) block copolymer (PIBZ-7).

The molecular weight of the copolymer (PIBZ-7) was measured by GPC under a THF solvent, and as the result, it was confirmed that the copolymer had a number average molecular weight (Mn) of 8500 g/mol and a weight average molecular weight (Mw) of 16,500 g/mol.

Example 8

7.5 g of a poly(imide-benzoxazine) block copolymer (PIBZ-8) was obtained by the same method as Example 7, except that 1.9 g of 4,4'-oxydianiline was used instead of 1.9 g of 4,4'-diaminodiphenyl methane.

The molecular weight of the copolymer (PIBZ-8) was measured by GPC under a THF solvent, and as the result, it was confirmed that the copolymer had a number average molecular weight (Mn) of 9000 g/mol and a weight average molecular weight (Mw) of 16,000 g/mol.

Example 9

7.8 g of a poly(imide-benzoxazine) block copolymer (PIBZ-9) was obtained by the same method as Example 7, except that 4.2 g of 4,4'-(hexafluoroisopropylidene)diphthalic anhydride was used instead of 3.8 g of 4,4'-oxydiphthalic anhydride.

The molecular weight of the copolymer (PIBZ-9) was measured by GPC under a THF solvent, and as the result, it was confirmed that the copolymer had a number average molecular weight (Mn) of 8500 g/mol and a weight average molecular weight (Mw) of 17,500 g/mol.

Comparative Example 1

5 g of 5,5'-(perfluoropropane-2,2-diyl)bis(2-aminophenol) was dissolved in N-methyl-2-pyrrolidone (NMP). Thereto, 3.8 g of dibutyl 5,5'-oxybis(2-(chlorocarbonyl)benzoate) was slowly added dropwise at 0° C. After the mixture was reacted for 2 hours, 1.2 g of maleic anhydride was added, and the reaction mixture was additionally reacted for 2 hours. After the reaction, an excess amount of distilled water was dripped therein to produce a precipitate. The precipitate was filtered and washed with water three times, and then dried under a 100° C. vacuum condition for 24 hours to obtain 5 g of a polyimide (PI-1).

The molecular weight of the polyimide (PI-1) was measured by GPC under a THF solvent, and as the result, it was confirmed that the copolymer had a number average molecular weight (Mn) of 6500 g/mol and a weight average molecular weight (Mw) of 12,000 g/mol.

Comparative Example 2

4.8 g of 5,5'-(perfluoropropane-2,2-diyl)bis(2-aminobenzene) was dissolved in N-methyl-2-pyrrolidone(NMP). Thereto, 3.8 g of dibutyl 5,5'-oxybis(2-(chlorocarbonyl)benzoate) was slowly added dropwise at 0° C. After the mixture was reacted for 2 hours, 1.2 g of maleic anhydride was added, and the reaction mixture was additionally reacted for 2 hours. After the reaction, an excess amount of distilled water was dripped thereto to produce a precipitate. The precipitate was filtered and washed with water three times, and then dried under a 100° C. vacuum condition for 24 hours to obtain 5 g of a polyimide (PI-2).

The molecular weight of the polyimide (PI-2) was measured by GPC under a THF solvent, and as the result, it was confirmed that the copolymer had a number average molecular weight (Mn) of 6500 g/mol and a weight average molecular weight (Mw) of 12,500 g/mol.

Comparative Example 3

5 g of 5,5'-(perfluoropropane-2,2-diyl)bis(2-aminophenol) was dissolved in N-methyl-2-pyrrolidone (NMP). After raising the temperature to 80° C., 3.4 g of 4,4'-oxydiphthalic anhydride was added dropwise, and the reaction mixture was reacted for 2 hours. Thereafter, 0.4 g of pyridine and 1.8 g of acetic anhydride were slowly introduced. After the mixture was reacted for 12 hours, it was precipitated with 500 ml of methanol. The precipitate was filtered and washed with water three times, and then dried under a 100° C. vacuum condition for 24 hours to obtain 6 g of a polyimide (PI-3).

The molecular weight of the polyimide (PI-3) was measured by GPC under a THF solvent, and as the result, it was confirmed that the copolymer had a number average molecular weight (Mn) of 7500 g/mol and a weight average molecular weight (Mw) of 15,000 g/mol.

Preparation Examples 1 to 12

The photosensitive resin compositions of Preparation Examples 1 to 12 were respectively prepared by mixing the components shown in the following Table 1. In Table 1, the content of each component was based on 100 parts by weight of the polymer PIBZ-1, PIBZ-2, PIBZ-3, PIBZ-4, PIBZ-5, PIBZ-6, PIBZ-7, PIBZ-8, PIBZ-9, PI-1, PI-2, or PI-3) according to the examples and comparative examples.

In Table 1, each component used for the preparation examples are as follows.

[PIBZ-1] poly(imide-benzoxazine) block copolymer according to Example 1

[PIBZ-2] poly(imide-benzoxazine) block copolymer according to Example 2

[PIBZ-3] poly(imide-benzoxazine) block copolymer according to Example 3

[PIBZ-4] poly(imide-benzoxazine) block copolymer according to Example 4

[PIBZ-5] poly(imide-benzoxazine) block copolymer according to Example 5

[PIBZ-6] poly(imide-benzoxazine) block copolymer according to Example 6

[PIBZ-7] poly(imide-benzoxazine) block copolymer according to Example 7

[PIBZ-8] poly(imide-benzoxazine) block copolymer according to Example 8

[PIBZ-9] poly(imide-benzoxazine) block copolymer according to Example 9

[PI-1] polyimide according to Comparative Example 1
[PI-2] polyimide according to Comparative Example 2
[PI-3] polyimide according to Comparative Example 3
[B] a photoacid generator of the following chemical formulas

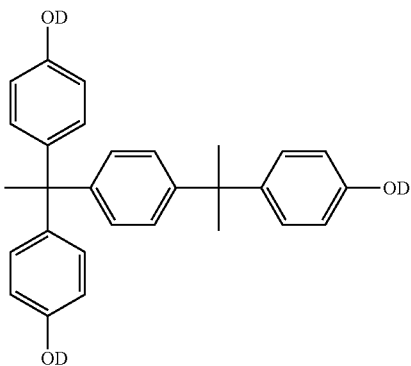

[C] a photoacid generator of the following chemical formula

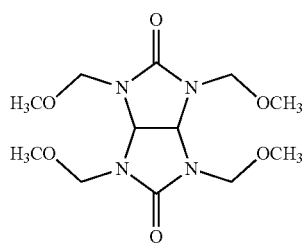 [SMILES: COCN1C(=O)N(COC)C2C1N(COC)C(=O)N2COC]

[D] a photocurable multifunctional acrylic compound according to the following chemical formula

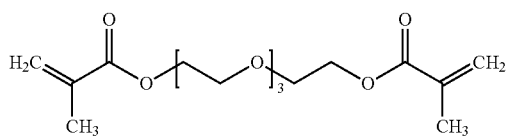

[E] gamma-butyrolactone (GBL)

Experimental Example 1: Adhesion of a Cured Film

The photosensitive resin compositions according to the preparation examples were respectively coated on a silicon wafer substrate on which a 4-inch silicone wafer and Cu were coated to a thickness of 300 nm by spin coating, and then dried at 120° C. for 2 minutes, and exposed in a broadband aligner exposure apparatus at 500 mJ/cm$^2$. They were cured again at 200° C. for 2 hours to obtain a substrate on which a cured film with a thickness of about 4.3 to 4.5 μm was formed.

The substrate on which a cured film was formed was evaluated for adhesion of the cured film (cohesion to the substrate) through a taping test according to the TPC-TM-650 method. Specifically, using a knife for a taping test only (Cross Hatch Cutter, YCC-230/1), 10×10 lattice-shaped sheathes were made only on the upper cured film without damaging the lower wafer (the size of each lattice was 100 μm, and the number of lattices was 100), and a Nichibang tape was firmly adhered to the surface of the cured film. 60 seconds after the adhesion, the end of the tape was bent 180 degrees and peeled off with the same force. Here, the number of lattices of the cured film, which were peeled off together with the tape, was counted to evaluate cohesion to the substrate, and the results are shown in the following Table 2.

TABLE 2

| | Preparation Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Number of lattices peeled off | 0 | 0 | 1 | 0 | 0 | 0 | 0 | 0 | 0 | 2 | 5 | 4 |

Experimental Example 2: Chemical Resistance of a Cured Film

The photosensitive resin compositions according to the preparation examples were respectively coated on a 4 inch silicon wafer by spin coating of 800 to 1200 rpm, and then dried at 120° C. for 2 minutes to obtain a substrate on which a photosensitive resin film with a thickness of 5.0 μm was formed.

TABLE 1

| | Preparation Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| PIBZ-1 | 100 | — | — | — | — | — | — | — | — | — | — | — |
| PIBZ-2 | — | 100 | — | — | — | — | — | — | — | — | — | — |
| PIBZ-3 | — | — | 100 | — | — | — | — | — | — | — | — | — |
| PIBZ-4 | — | — | — | 100 | — | — | — | — | — | — | — | — |
| PIBZ-5 | — | — | — | — | 100 | — | — | — | — | — | — | — |
| PIBZ-6 | — | — | — | — | — | 100 | — | — | — | — | — | — |
| PIBZ-7 | — | — | — | — | — | — | 100 | — | — | — | — | — |
| PIBZ-8 | — | — | — | — | — | — | — | 100 | — | — | — | — |
| PIBZ-9 | — | — | — | — | — | — | — | — | 100 | — | — | — |
| PI-1 | — | — | — | — | — | — | — | — | — | 100 | — | — |
| PI-2 | — | — | — | — | — | — | — | — | — | — | 100 | — |
| PI-3 | — | — | — | — | — | — | — | — | — | — | — | 100 |
| B | 30 | 30 | 30 | 30 | — | 30 | 30 | 30 | 30 | 30 | 30 | 30 |
| C | — | — | — | — | 10 | — | — | — | — | — | — | — |
| D | 30 | 30 | 30 | 30 | 30 | 30 | 30 | 30 | 30 | 30 | 30 | 30 |
| E | 150 | 150 | 150 | 150 | 150 | 150 | 150 | 150 | 150 | 150 | 150 | 150 |

Further, using a mask on which a micropattern was formed, it was exposed in a broadband aligner exposure apparatus at 500 mJ/cm². Thereafter, the exposed wafer was developed in an aqueous solution of 2.39 wt % tetramethyl ammonium hydroxide for 150 seconds, washed with ultra-pure water, and then dried under nitrogen to form a pattern on the photosensitive resin film. The substrate was cured again at 200° C. for 2 hours to obtain a substrate on which a cured film was formed.

The obtained substrate was soaked in acetone (AC), dimethylformamide (DMF), or gamma-butyrolactone (GBL) for 30 minutes, and then washed with isopropyl alcohol and dried under nitrogen, and then the surface was observed through a microscope. As results of observance, it was evaluated as "○" (generated) or "X" (not generated) according to whether or not damage such as molten marks or cracks were generated on the cured film. The results are shown in the following Table 3.

TABLE 3

| | Preparation Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| AC | X | X | X | X | X | X | X | X | X | X | X | X |
| DMF | X | X | X | X | X | X | X | X | X | ○ | ○ | ○ |
| GBL | X | X | X | X | X | X | X | X | X | ○ | ○ | ○ |

Experimental Example 3: Low Temperature Curing Property

In order to evaluate the low temperature curability of each photosensitive resin compositions according to the preparation examples, the same process as Experimental Example 2 was progressed, except that the curing temperatures were changed to 140° C., 160° C., 180° C., 200° C., and 220° C., thus obtaining a substrate on which a cured film was formed.

The obtained substrate was soaked in gamma-butyrolactone (GBL) for 30 minutes, and then washed with isopropyl alcohol and dried under nitrogen, and then the surface was observed with a microscope. As results of observation, it was evaluated as "○" (generated) or "X" (not generated) according to whether or not damage such as molten marks or cracks were generated. The results are shown in the following Table 4.

TABLE 4

| | Preparation Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| 140° C. | ○ | ○ | ○ | ○ | ○ | ○ | X | X | X | ○ | ○ | X |
| 160° C. | X | X | ○ | X | X | X | X | X | X | ○ | ○ | X |
| 180° C. | X | X | X | X | X | X | X | X | X | ○ | ○ | X |
| 200° C. | X | X | X | X | X | X | X | X | X | ○ | ○ | X |
| 220° C. | X | X | X | X | X | X | X | X | X | ○ | ○ | X |

Referring to Tables 1 to 4, it was confirmed that the photosensitive resin compositions of Preparation Examples 1 to 9 including the poly(imide-benzoxazine) block copolymers according to the examples provided cured films having excellent adhesion and chemical resistance, compared to the photosensitive resin compositions of Preparation Examples 10 to 12 including the polyimide according to the comparative examples.

Particularly, it was confirmed that the photosensitive resin compositions of Preparation Examples 1 to 6 can be cured even at a temperature of 160° C. or 180° C., which is remarkably lower than 300° C., the curing temperature of the existing photosensitive resin composition using a polyimide precursor.

The invention claimed is:
1. A photosensitive resin composition comprising:
a poly(imide-benzoxazine) block copolymer comprising one or more repeat units selected from the group consisting of a repeat unit represented by the following Chemical Formula 1 and a repeat unit represented by the following Chemical Formula 2; and
a photo-curable multifunctional acrylic compound:

[Chemical Formula 1]

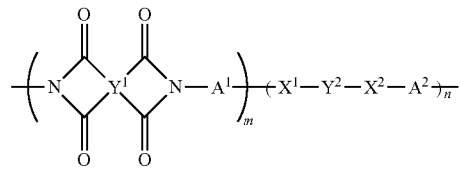

[Chemical Formula 2]

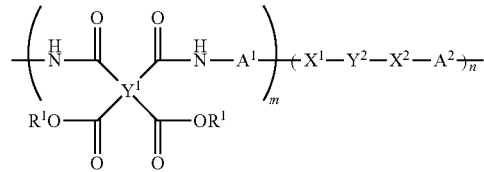

in Chemical Formulas 1 and 2,
$Y^1$ is a C6-20 tetravalent aliphatic cyclic group; a C6-20 tetravalent aromatic cyclic group; or a C4-20 tetravalent heteroaromatic cyclic group comprising one or more heteroatoms selected from the group consisting of N, O, and S; the tetravalent aliphatic cyclic group, tetravalent aromatic cyclic group, or tetravalent heteroaromatic cyclic group is unsubstituted or substituted with at least one of —OH, —F, —Cl, —Br, —I, —CF₃, —CCl₃, —CBr₃, —CI₃, —NO₂, —CN, —COCH₃, CH₃COO—, and —CO₂C₂H₅; the aliphatic cyclic group, aromatic cyclic group, or heteroaromatic cyclic group optionally has, two or more rings conjugated to form a condensed ring, or two or more rings linked by —O—, —S—, —C(=O)—, —CH(OH)—, —S(=O)₂—, —Si(CH₃)₂—, —(CH₂)$_p$—, —(CF₂)$_q$—, —C(CH₃)₂—, —C(CF₃)₂—, or —C(=O)NH—, wherein 1≤p≤10 and 1≤q≤10,
$Y^2$ includes a C6-20 divalent aliphatic cyclic group or a C6-20 divalent aromatic cyclic group; the divalent aliphatic or aromatic cyclic group is unsubstituted or substituted with at least one of —OH, —F, —Cl, —Br, —I, —CF₃, —CCl₃, —CBr₃, —CI₃, —NO₂, —CN, —COCH₃, CH₃COO—, and —CO₂C₂H₅; the divalent aliphatic or aromatic cyclic group optionally has two or more rings conjugated to form a condensed ring, or two or more rings linked by —O—, —S—, —C(=O)—, —CH(OH)—, —S(=O)₂—, —Si(CH₃)₂—, —(CH₂)$_p$—, —(CF₂)$_q$—, —C(CH₃)₂—, —C(CF₃)₂—, or —C(=O)NH—, wherein 1≤p≤10 and 1≤q≤10,
$R^1$'s are each independently a hydrogen atom, 2-hydroxybenzyl, 3-hydroxybenzyl, or 4-hydroxybenzyl, A¹ and A² are each independently a direct bond; a C6-20 divalent aliphatic cyclic group; a C6-20 divalent aromatic cyclic group; or a C4-20 tetravalent heteroaromatic cyclic group comprising one or more heteroatoms selected from the group consisting of N, O, and S, X¹ and X² are each independently a group represented by the following Chemical Formula 3a or 3b:

[Chemical Formula 3a]

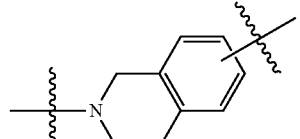

[Chemical Formula 3b]

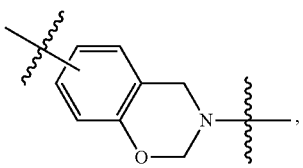

the mark

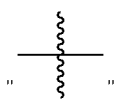

indicates a part where the group represented by Chemical Formula 3a or 3b is linked to an adjacent atom in the Chemical Formula 1, and m and n are each independently a number of 5 to 10,000.

2. The photosensitive resin composition according to claim 1, wherein Y¹ is a tetravalent group selected from the group consisting of the following structural formulas:

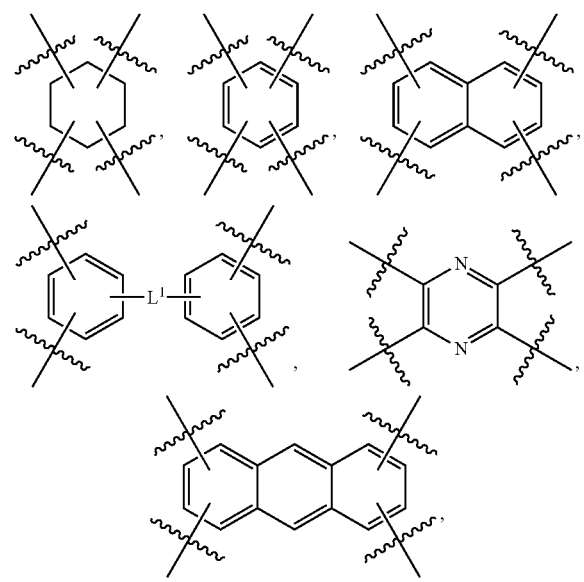

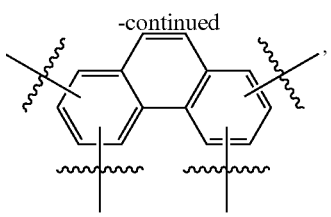

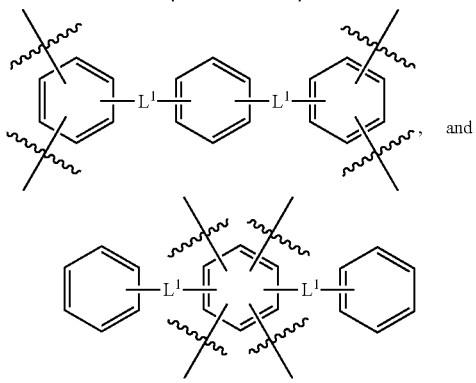

and in the structural formulas, each cyclic group is unsubstituted or substituted with —OH, —F, —Cl, —Br, —I, —$CF_3$, —$CCl_3$, —$CBr_3$, —$CI_3$, —$NO_2$, —CN, —$COCH_3$, $CH_3COO$—, and —$CO_2C_2H_5$, each L¹ is independently —O—, —S—, —C(=O)—, —CH(OH)—, —S(=O)$_2$—, —Si($CH_3$)$_2$—, —($CH_2$)$_p$—, —($CF_2$)$_q$—, —C($CH_3$)$_2$—, —C($CF_3$)$_2$—, or —C(=O)NH—, wherein $1 \leq p \leq 10$ and $1 \leq q \leq 10$, and

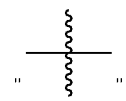

is a part where the tetravalent group is linked to an adjacent atom in the Chemical Formula 1.

3. The photosensitive resin composition according to claim 1, wherein Y² is a divalent group selected from the group consisting of the following structural formulas:

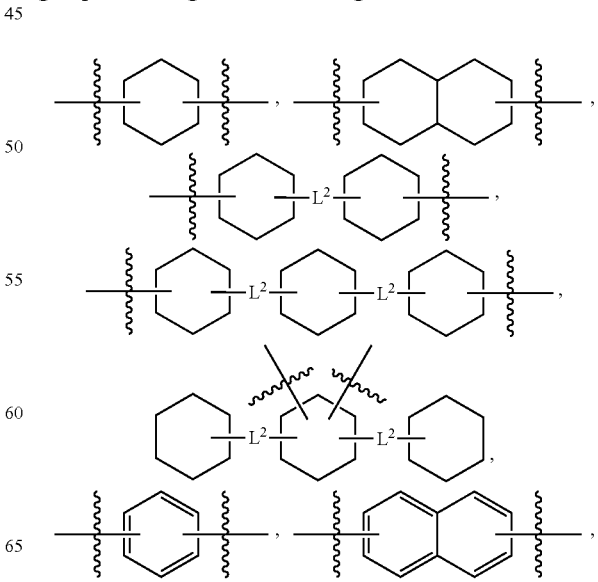

-continued

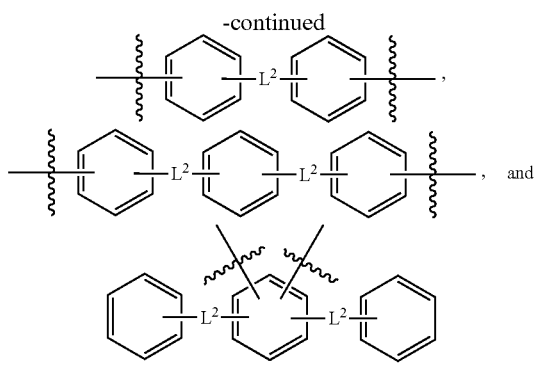

and in the structural formulas,
each cyclic group is unsubstituted or substituted with —OH, —F, —Cl, —Br, —I, —CF$_3$, —CCl$_3$, —CBr$_3$, —CI$_3$, —NO$_2$, —CN, —COCH$_3$, CH$_3$COO—, and —CO$_2$C$_2$H$_5$,
each L$^2$ is independently, a —O—, —S—, —C(=O)—, —CH(OH)—, —S(=O)$_2$—, —Si(CH$_3$)$_2$—, —(CH$_2$)$_p$—, —(CF$_2$)$_q$—, —C(CH$_3$)$_2$—, —C(CF$_3$)$_2$—, or —C(=O)NH—, wherein 1≤p≤10 and 1≤q≤10, and

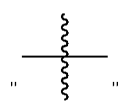

is a part where the divalent group is linked to an adjacent atom in the Chemical Formula 1.

4. The photosensitive resin composition according to claim 1, wherein A$^1$ and A$^2$ are each independently a direct bond or a divalent group selected from the group consisting of the following structural formulas:

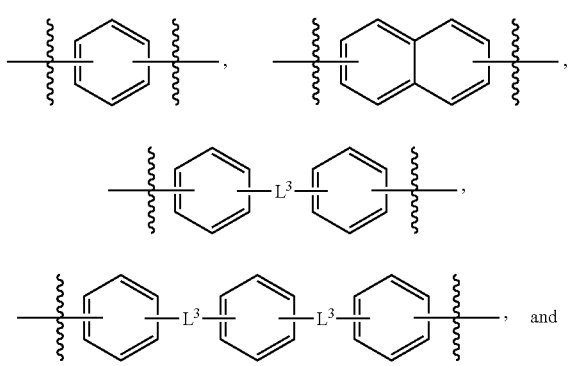

and in the structural formulas,
each L$^3$ is independently —O—, —S—, —C(=O)—, —CH(OH)—, —S(=O)$_2$—, —Si(CH$_3$)$_2$—, —(CH$_2$)$_p$—, —(CF$_2$)$_q$—, —C(CH$_3$)$_2$—, —C(CF$_3$)$_2$—, or —C(=O)NH—, wherein 1≤p≤10 and 1≤q≤10, and

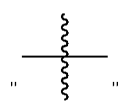

is a part where the divalent group is linked to an adjacent atom in the Chemical Formula 1.

5. The photosensitive resin composition according to claim 1, wherein Chemical Formula 1 is represented by the following Chemical Formula 4:

[Chemical Formula 4]

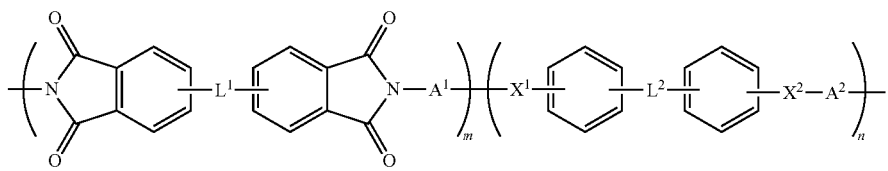

and in Chemical Formula 4,
A$^1$, A$^2$, X$^1$, X$^2$, m, and n are each independently as defined in claim 1, and
L$^1$ and L$^2$ are each independently —O—, —S—, —C(=O)—, —CH(OH)—, —S(=O)$_2$—, —Si(CH$_3$)$_2$—, —(CH$_2$)$_p$—, —(CF$_2$)$_q$—, —C(CH$_3$)$_2$—, —C(CF$_3$)$_2$—, or —C(=O)NH—, wherein 1≤p≤10 and 1≤q≤10.

6. The photosensitive resin composition according to claim 1, wherein in the poly(imide-benzoxazine) block copolymer, the weight ratio of the repeat unit having a polymerization degree m and the repeat unit having a polymerization degree n is 1:0.01 to 1:100.

7. The photosensitive resin composition according to claim 1, wherein the poly(imide-benzoxazine) block copolymer has a weight average molecular weight of 5000 to 100,000 g/mol.

8. The photosensitive resin composition according to claim 1, wherein the photocurable multifunctional acrylic compound includes one or more acrylic compounds selected from the group consisting of an acrylate-based compound, a polyester acrylate based compound, a polyurethane acrylate based compound, an epoxy acrylate based compound, and a caprolactone modified acrylate based compound.

9. The photosensitive resin composition according to claim 1, wherein the composition comprises 1 to 50 parts by weight of the photocurable multifunctional acrylic compounds, based on 100 parts by weight of the poly(imide-benzoxazine) block copolymer.

10. A method of preparing a film comprising curing the photosensitive resin composition of claim 1.

11. The method of claim 10, wherein the curing is performed at a temperature of from 160 to 220° C.

12. A film formed by the method of claim 10.

* * * * *